(12) United States Patent
Ji

(10) Patent No.: US 12,406,706 B2
(45) Date of Patent: Sep. 2, 2025

(54) TIMING SEQUENCE CONTROL CIRCUIT, TIMING SEQUENCE CONTROL METHOD, AND SEMICONDUCTOR MEMORY

(71) Applicant: CHANGXIN MEMORY TECHNOLOGIES, INC., Hefei (CN)

(72) Inventor: Kangling Ji, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 274 days.

(21) Appl. No.: 18/169,159

(22) Filed: Feb. 14, 2023

(65) Prior Publication Data
US 2023/0386540 A1 Nov. 30, 2023

(30) Foreign Application Priority Data
May 24, 2022 (CN) .......................... 202210570667.X

(51) Int. Cl.
*G11C 7/22* (2006.01)
*G11C 5/14* (2006.01)
*G11C 7/10* (2006.01)

(52) U.S. Cl.
CPC .............. *G11C 7/222* (2013.01); *G11C 5/147* (2013.01); *G11C 7/1066* (2013.01)

(58) Field of Classification Search
CPC ........ G11C 7/222; G11C 5/147; G11C 7/1066
USPC ....................................................... 365/233.1
See application file for complete search history.

(56) References Cited

U.S. PATENT DOCUMENTS 10,991,416 B1 * 4/2021 Ladner ................ G11C 11/4093

FOREIGN PATENT DOCUMENTS

CN 107452415 A * 12/2017 ......... G11C 11/4063

OTHER PUBLICATIONS

Machine English translation of CN107452415, 15 pages, retrieved from eSpacenet's Patent Translate feature on Jan. 8, 2025.*

* cited by examiner

*Primary Examiner* — Alexander Sofocleous
*Assistant Examiner* — Tracy Hampton
(74) *Attorney, Agent, or Firm* — Syncoda LLC; Feng Ma

(57) ABSTRACT

A timing sequence control circuit includes: a signal transmission module and a timing sequence compensation module, and the timing sequence compensation module is connected with the signal transmission module. Herein, the signal transmission module is configured to receive an initial sampling signal and transmit the initial sampling signal to generate a sampling signal. The timing sequence compensation module at least includes a compensation capacitor and is configured to receive an adjustable supply voltage, and perform compensation delay adjustment on the initial sampling signal according to the supply voltage and the compensation capacitor, so that the time difference between the sampling signal and a to-be-sampled Data (DQ) signal meets a preset requirement.

17 Claims, 6 Drawing Sheets

TIMING SEQUENCE CONTROL CIRCUIT, TIMING SEQUENCE CONTROL METHOD, AND SEMICONDUCTOR MEMORY

CROSS-REFERENCE TO RELATED APPLICATION

The present application claims priority to Chinese Patent Application No. 202210570667.X filed on May 24, 2022, the disclosure of which is hereby incorporated by reference in its entirety.

BACKGROUND

With the continuous development of semiconductor technology, the speed of data transmission is increasingly demanded when devices such as computers are manufactured and used. In order to achieve greater data transmission speed, a series of memory devices have been developed in which data can be transmitted at Double Data Rate (DDR).

In a DDR transmission device, a rising edge and a falling edge of a data strobe signal are synchronized with input and output data, thus realizing double-rate data transmission. Usually, the transmission path of the Data Strobe (DQS) signal is different from the transmission path of the Data (DQ) signal, which leads to different time to reach a data receiving position. In order to enable the two signals to reach the data receiving position at the same time, at present, a set delay time is mostly added to the transmission of the timing sequence signal to acquire timing sequence synchronization between the DQS signal and the DQ signal. However, the fluctuation of the supply voltage and ambient temperature may affect the delay time to some extent, and then affect the effect of signal timing sequence synchronization.

SUMMARY

The disclosure relates to the technical field of semiconductors, and in particular to a timing sequence control circuit, a timing sequence control method and a semiconductor memory.

According to a first aspect, the embodiments of the disclosure provide a timing sequence control circuit. The timing sequence control circuit includes a signal transmission module and a timing sequence compensation module, and the timing sequence compensation module is connected with the signal transmission module.

The signal transmission module is configured to receive an initial sampling signal and transmit the initial sampling signal to generate a sampling signal.

The timing sequence compensation module at least includes a compensation capacitor, the timing sequence compensation module is configured to receive an adjustable supply voltage, and perform compensation delay adjustment on the initial sampling signal according to the supply voltage and the compensation capacitor, so that a time difference between the sampling signal and a to-be-sampled DQ signal meets a preset requirement.

According to a second aspect, the embodiments of the disclosure provide a timing sequence control method, which may include the following operations.

An initial sampling signal and a to-be-sampled DQ signal are received.

The initial sampling signal is transmitted through a signal transmission module to generate a sampling signal.

An adjustable supply voltage is received through a timing sequence compensation module, and compensation delay adjustment is performed on the initial sampling signal according to the supply voltage and a compensation capacitor in the timing sequence compensation module, so that a time difference between the sampling signal and the to-be-sampled DQ signal meets a preset requirement.

According to a third aspect, the embodiments of the disclosure provide a semiconductor memory, which may include a timing sequence control circuit as described in the first aspect.

DETAILED DESCRIPTION

Figure 1:
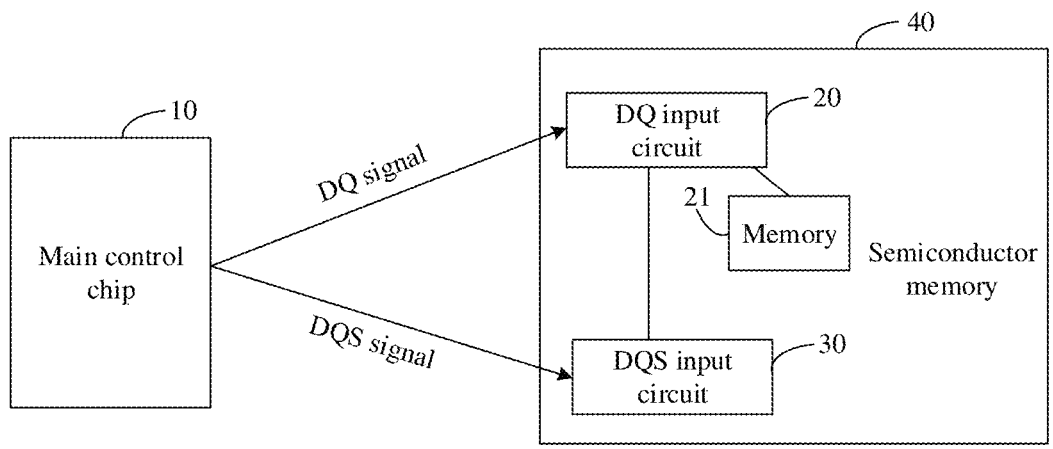
FIG. 1 is a schematic diagram of transmission of a DQS signal and a DQ signal from a main control chip to a semiconductor memory.

Technical solutions in the embodiments of the disclosure are clearly and completely described below in combination with the drawings in the embodiments of the disclosure. It is to be understood that the specific embodiments described herein are merely illustrative of the disclosure and are not intended to limit the disclosure. In addition, it is also to be noted that, for ease of description, only the parts related to the relevant disclosure are illustrated in the drawings.

Unless otherwise defined, all technological and scientific terms used in the disclosure have meanings the same as those usually understood by those skilled in the art of the disclosure. The terms used in the disclosure are only adopted to describe the embodiments of the disclosure and not intended to limit the disclosure.

"Some embodiments" involved in the following descriptions describes a subset of all possible embodiments. However, it can be understood that "some embodiments" may be the same subset or different subsets of all the possible embodiments, and may be combined without conflicts.

It is to be pointed out that terms "first/second/third" involved in the embodiments of the disclosure are only for distinguishing similar objects and do not represent a specific sequence of the objects. It can be understood that "first/second/third" may be interchanged to specific sequences or orders if allowed to implement the embodiments of the disclosure described herein in sequences except the illustrated or described ones.

It is also to be pointed out that the high level and low level used by a signal related to the embodiments of the present disclosure refer to logic level of the signal. A signal with a high level is different from same with a low level. For example, the high level may correspond to a signal with a first voltage, and the low level may correspond to a signal with a second voltage. In some embodiments, the first voltage is greater than the second voltage. In addition, the logic level of the signal may be different from or opposite to the described logic level. For example, a signal described as having a logic "high" level may alternatively have a logic "low" level, and a signal described as having a logic "low" level may alternatively have a logic "high" level.

It is to be understood that the function of a DQS signal is an important function in a Double Data Rate Dynamic Random Access Memory (DDR DRAM), which is mainly used to accurately distinguish each transmission cycle within one clock cycle and facilitate a receiver accurately receiving data. The DQS signal is a data synchronization signal. As illustrated in FIG. 1, when data is written, a main control chip 10 sends the DQS signal to a semiconductor memory 40, that is, the DRAM chip, and data synchronization is performed via the DQS signal.

In the semiconductor memory such as an LPDDR4, during writing, the DQS signal and the DQ signal are transmitted to the LPDDR4 at approximately the same speed through transmission paths with approximately the same length. In the LPDDR4, a DQS input circuit 20 captures data according to a rising edge and a falling edge of the DQS signal, and stores the data in the memory 21. For example, the main control chip 10 controls DQS (0) to become DQS (1), or DQS (1) to become DQS (0). Every time the DQS signal changes, the DQ input circuit 20 captures data once according to the above change and stores the data.

Since it takes approximately the same time for the DQS signal and the DQ signal to reach the LPDDR4 chip, it may take some time for the DQS signal to be transmitted to the DQ input circuit 20 inside the LPDDR4 chip. The transmission time difference between the DQS signal and the DQ signal causes asynchronous timing sequence of the DQS signal and the DQ signal. In order to avoid the asynchronous timing sequence, the current operation mode is that the main control chip 10 sends the DQS signal to the LPDDR4 chip in advance by a delay time (may be represented by tDQS2DQ), so that the DQS signal and the DQ signal can reach the DQ input circuit 20 synchronously, thus improving the accuracy of data capture by the DQ input circuit 20.

However, the delay time tDQS2DQ is prone to being affected by a factor such as the internal working voltage or working temperature of the LPDDR4 chip, which leads to the main control chip 10 adjusting the delay time tDQS2DQ by constantly detecting the change of the parameter such as the internal working voltage or working temperature. However, the main control chip 10 takes time and energy to detect the change of the parameter such as the internal working voltage or working temperature of the LPDDR4 chip, which eventually leads to the slow writing speed.

In addition, the delay time tDQS2DQ is very sensitive to the internal working voltage or working temperature, which makes the fluctuation of the internal working voltage or working temperature affect the delay time tDQS2DQ to some extent, thus affecting the effect of signal timing sequence synchronization.

Based thereon, the embodiments of the disclosure provide a timing sequence control circuit. The timing sequence control circuit is provided with a timing sequence compensation module, and compensation delay adjustment is performed on the initial sampling signal by using the supply voltage and the compensation capacitor, so that the influence of the change of a parameter such as the internal working voltage or working temperature on the delay time may be reduced, and accordingly the accuracy of the delay time can be improved and timing sequence synchronization between the initial sampling signal and the DQ signal can be improved.

Various embodiments of the present disclosure will now be described in detail in combination with the accompanying drawings.

Figure 2:
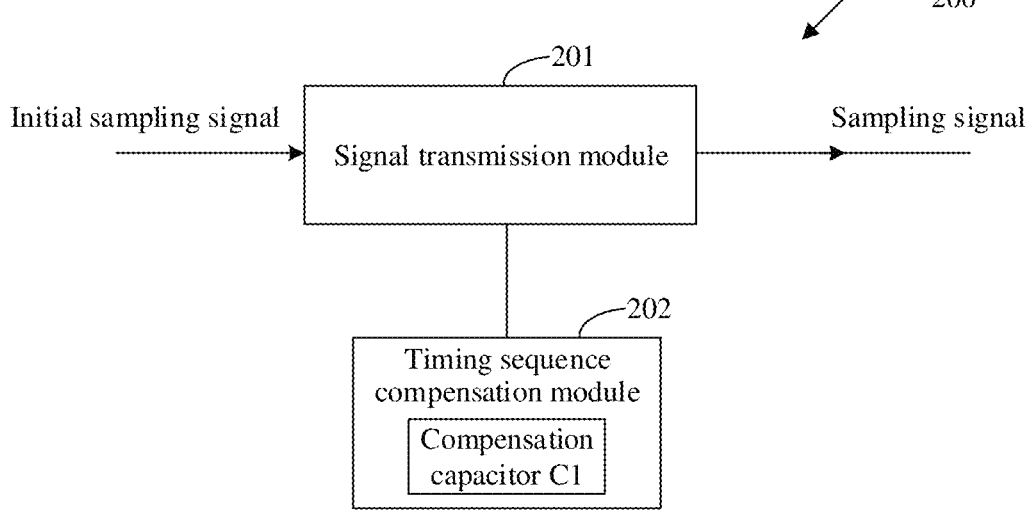
FIG. 2 is a composition structure diagram I of a timing sequence control circuit according to an embodiment of the disclosure.

In an embodiment of the disclosure, referring to FIG. 2, FIG. 2 is a composition structure diagram of a timing sequence control circuit 200 according to an embodiment of the disclosure. As illustrated in FIG. 2, the timing sequence control circuit 200 may include a signal transmission module 201 and a timing sequence compensation module 202, and the timing sequence compensation module 202 is connected with the signal transmission module 201.

The signal transmission module 201 is configured to receive an initial sampling signal and transmit the initial sampling signal to generate a sampling signal.

The timing sequence compensation module 202 at least includes a compensation capacitor C1, and is configured to receive an adjustable supply voltage, and perform compensation delay adjustment on the initial sampling signal according to the supply voltage and the compensation capacitor C1, so that a time difference between the sampling signal and a to-be-sampled DQ signal meets a preset requirement.

It is to be noted that, in the embodiment of the disclosure, the timing sequence control circuit 200 is configured to adjust a timing sequence relationship between the initial sampling signal and the DQ signal. Herein, the initial sampling signal may be one of the following: a DQS signal and a WCK signal. Specifically, in the LPDDR4 chip, the initial sampling signal may be a DQS signal. In the LPDDR5 chip, the initial sampling signal may be a WCK signal.

It is also to be noted that, in the embodiment of the disclosure, the compensation capacitor C1 mainly performs compensation delay adjustment on the initial sampling signal. Herein, if a capacitance value of the compensation capacitor C1 is large, the dischargable charge thereof is large, and the discharge speed is fast, which facilitates prolonging the delay time caused by the compensation capacitor C1. On the contrary, if the capacitance value of the compensation capacitor C1 is small, the dischargeable charge thereof is small, the discharge speed is slow, and the corresponding delay time is short. Thus, the overall delay time tDQS2DQ can be adjusted by the compensation capacitor C1, so that the time difference between the sampling signal and the to-be-sampled DQ signal can meet the preset requirement, thus improving the timing sequence synchronization between the DQS/WCK signal and the DQ signal.

Figure 3:
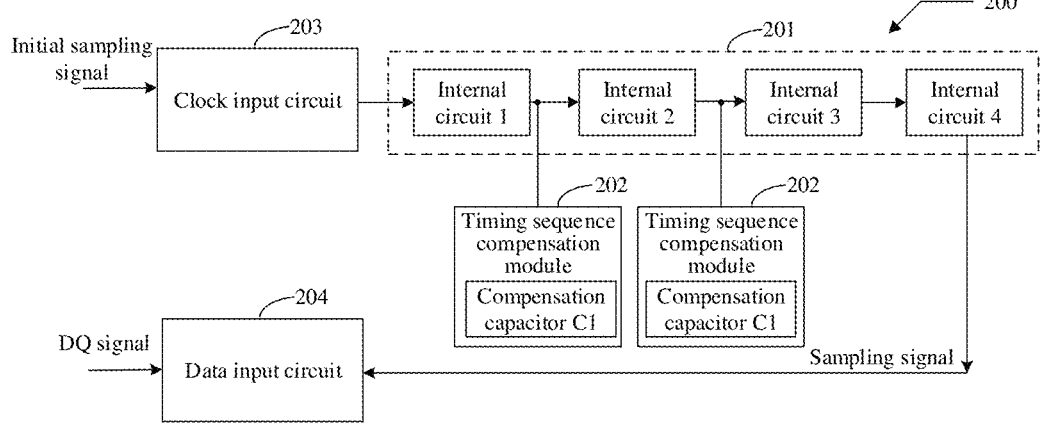
FIG. 3 is a composition structure diagram II of a timing sequence control circuit according to an embodiment of the disclosure.

In some embodiments, on the basis of the timing sequence control circuit 200 illustrated in FIG. 2, referring to FIG. 3, the timing sequence control circuit 200 may further include a clock input circuit 203 and a data input circuit 204. An input end of the signal transmission module 201 is connected with an output end of the clock input circuit 203, and an output end of the signal transmission module 201 is connected with an input end of the data input circuit 204. Herein, the signal transmission module 201 may include at least one internal circuit, and when there are a plurality of internal circuits, the plurality of internal circuits are connected in sequence in the transmission direction from the clock input circuit 203 to the data input circuit 204.

It is to be noted that, in the embodiment of the disclosure, as specifically illustrated in FIG. 3, the signal transmission module 201 may include an internal circuit 1, an internal circuit 2, an internal circuit 3 and an internal circuit 4. That is, on the transmission line from the clock input circuit 203 to the data input circuit 204, the internal circuit 1, the internal circuit 2, the internal circuit 3 and the internal circuit 4 are connected in sequence.

It is also to be noted that, in the embodiment of the disclosure, in the LPDDR4 chip, the clock input circuit 203 may be a DQS input circuit, and the data input circuit 204 may be a DQ input circuit. In the LPDDR5 chip, the clock input circuit 203 may be a WCK input circuit, and the data input circuit 204 may be a DQ input circuit.

In some embodiments, the number of the timing sequence compensation modules 202 may be at least one, and different timing sequence compensation modules 202 correspond to different internal circuits. Each timing sequence compensation module 202 is connected with the output end of the corresponding internal circuit to perform timing sequence compensation on the output signal of the internal circuit, so that the timing sequence of the signal input to the next internal circuit meets the requirements or the overall delay of the signal transmission module 201 meets the requirements. Specifically, as illustrated in FIG. 3, the output ends of the internal circuit 1 and the internal circuit 2 are respectively connected with a timing sequence compensation module 202.

In the embodiment of the disclosure, the driving ability and transmission speed of the initial sampling signal may change due to the influence of air Pressure, Voltage and Temperature (PVT) during the transmission of the internal circuit. Therefore, a timing sequence compensation module 202 needs to be connected in parallel at the output end of the internal circuit, to perform timing sequence compensation on the output signal of the internal circuit. It is to be noted that, taking the internal circuits 1, 2, 3 and 4 in FIG. 3 as an example, the number of internal circuits connected with the timing sequence compensation module 202 is not particularly limited, and the timing sequence compensation module 202 may be arranged for any one or more internal circuits, as long as the time difference between the sampling signal and the to-be-sampled DQ signal meets the preset requirement.

Specifically, if the delay of the initial sampling signal by the internal circuit is relatively long, the delay compensation of the timing sequence compensation module 202 is reduced. Otherwise, the delay compensation of the timing sequence compensation module 202 is increased, so that the timing sequence of the signal input to the next internal circuit meets the requirements or the overall delay of the signal transmission module 201 meets the requirements.

Figure 4:
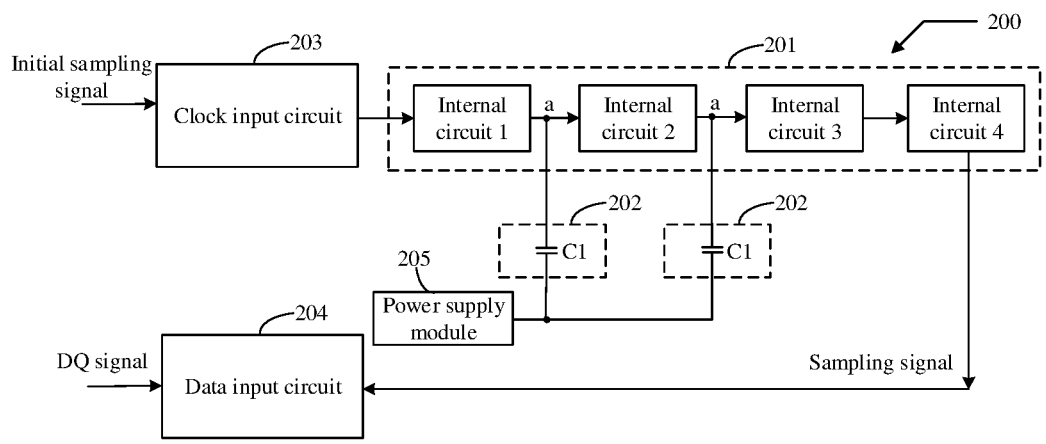
FIG. 4 is a composition structure diagram III of a timing sequence control circuit according to an embodiment of the disclosure.

In a possible implementation mode, on the basis of the timing sequence control circuit 200 illustrated in FIG. 3, referring to FIG. 4, the timing sequence control circuit 200 may further include a power supply module 205. Herein, one end of the compensation capacitor C1 is connected with the power supply module 205, and another end of the compensation capacitor C1 is connected with the output end of the corresponding internal circuit.

The power supply module 205 is configured to provide and adjust the supply voltage, so as to adjust the discharge speed of the compensation capacitor through coupling effect.

That is, in the embodiment of the disclosure, the timing sequence compensation module 202 may only include the compensation capacitor C1. Herein, one end of the compensation capacitor C1 is connected with the power supply module 205, and the other end of the compensation capacitor C1 is connected with the output end of the corresponding internal circuit to form a connection node a. By adjusting the supply voltage, the potential difference at the connection node a may be adjusted, and then the discharge speed of the compensation capacitor C1 is adjusted.

In a specific embodiment, for the timing sequence compensation module 202, if the supply voltage provided by the power supply module 205 is increased, the potential difference at the connection node a may be increased through coupling effect, so that the discharge speed of the compensation capacitor C1 becomes fast, and the delay time caused by the compensation capacitor C1 is further prolonged. If the supply voltage provided by the power supply module 205 is reduced, the potential difference at the connection node a may be reduced through coupling effect g, so that the discharge speed of the compensation capacitor C1 becomes slow, and the delay time caused by the compensation capacitor C1 can be shortened. It is to be understood that the discharge speed of the compensation capacitor C1 must reach a certain value to make up for the jump of the output signal from a high level to a low level, thus delaying the falling edge of the output signal.

Figure 5:
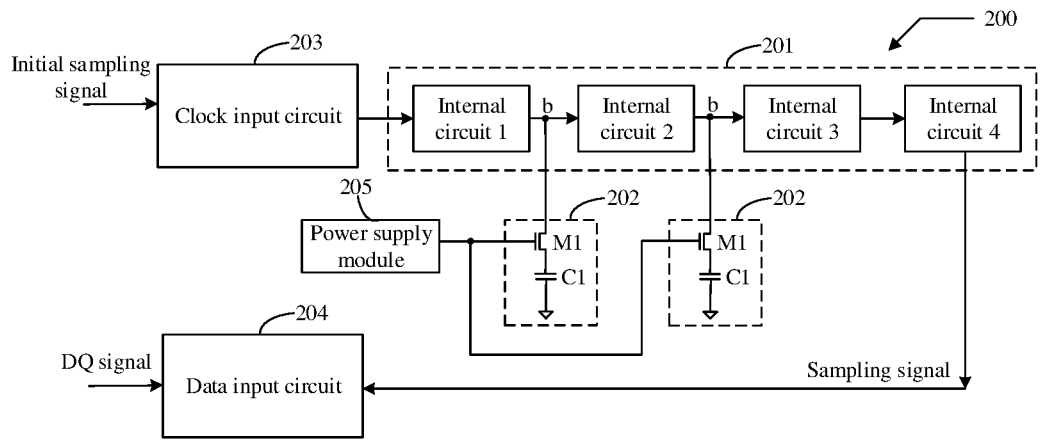
FIG. 5 is a composition structure diagram IV of a timing sequence control circuit according to an embodiment of the disclosure.

In another possible implementation mode, on the basis of the timing sequence control circuit 200 illustrated in FIG. 4, referring to FIG. 5, the timing sequence compensation module 202 may also include a first switching transistor M1. Herein, a gate electrode of the first switching transistor M1 is connected with the power supply module 205, a source electrode of the first switching transistor M1 is connected with one end of the compensation capacitor C1, another end of the compensation capacitor C1 is connected with a low level, and a drain electrode of the first switching transistor M1 is connected with the output end of the corresponding internal circuit.

The power supply module 205 is configured to provide and adjust the supply voltage so as to control the conduction degree of the first switching transistor, and adjust the discharge speed of the compensation capacitor according to the conduction degree of the first switching transistor.

That is, in the embodiment of the disclosure, the timing sequence compensation module 202 may include a first switching transistor M1 and a compensation capacitor C1. Herein, one end of the compensation capacitor C1 is connected with the source electrode of the first switching transistor M1, and the other end of the compensation capacitor C1 is connected with the output end of the corresponding internal circuit to form a connection node b. By adjusting the supply voltage, the conduction degree of the first switching transistor M1 may be controlled, and then the discharge speed of the compensation capacitor C1 is adjusted.

If the level value at the connection node b is greater than a preset upper limit value, the level value at the connection node b may charge the compensation capacitor C1. When the level value at the connection node b is lower than the preset upper limit value, the compensation capacitor C1 may perform discharging at this time to raise the level value at the connection node b, so as to delay the time when the point b jumps from a high level to a low level. In addition, in the embodiment of the disclosure, the first switching transistor M1 may be an N-type Metal-Oxide-Semiconductor Field-Effect Transistor (MOSFET), which may be simply referred to as an NMOS transistor, but not specifically limited here.

In another specific embodiment, for the timing sequence compensation module 202, if the supply voltage provided by the power supply module 205 is increased, the conduction degree of the first switching transistor M1 is increased, which may improve the discharge speed of the compensation capacitor C1 and can increase the delay time caused by the compensation capacitor C1. If the supply voltage provided by the power supply module 205 decreases, the conduction degree of the first switching transistor M1 decreases, which may reduce the discharge speed of the compensation capacitor C1 and can shorten the delay time caused by the compensation capacitor C1.

In such an implementation mode, the power supply module 205 may provide an adjustable supply voltage, and by controlling the conduction degree of the first switching transistor M1, and adjusting the discharge speed of the compensation capacitor C1 according to the conduction degree of the first switching transistor M1, the overall delay time tDQS2DQ can also be adjusted.

In some embodiments, the compensation capacitor C1 is configured to adjust the delay time of the initial sampling signal.

When an initial delay time of the initial sampling signal by the timing sequence control circuit 200 is increased, a discharge speed of the compensation capacitor C1 is reduced so as to reduce a delay time of the initial sampling signal by the compensation capacitor C1.

When the initial delay time of the initial sampling signal by the timing sequence control circuit 200 is reduced, the discharge speed of the compensation capacitor C1 is increased so as to increase the delay time of the initial sampling signal by the compensation capacitor C1.

It is to be noted that, in the embodiment of the disclosure, the compensation capacitor C1 is mainly used to delay the duration of the high level. That is, if the initial delay time generated by the timing sequence control circuit 200 for the initial sampling signal is smaller, the delay time caused by the compensation capacitor C1 may be increased, so that the sum of the delay times thereof is maintained in a stable state.

Specifically, taking the change of the working temperature as an example, if the initial delay time of the initial sampling signal generated by the timing sequence control circuit 200 due to the change of the working temperature is small, the discharge speed of the compensation capacitor C1 needs to be accelerated to increase the delay time caused by the compensation capacitor C1. On the contrary, if the initial delay time of the initial sampling signal generated by the timing sequence control circuit 200 due to the change of the working temperature is large, the discharge speed of the compensation capacitor C1 needs to slow down to reduce the delay time caused by the compensation capacitor C1, so that the sum of the delay times thereof may be maintained in a stable state, thereby improving the timing sequence synchronization between the DQS/WCK signal and the DQ signal.

In some embodiments, for the internal circuit in the signal transmission module 201, the internal circuit may include a Buffer.

It is to be noted that, for the Buffer, the Buffer may be composed of an inverter. Here, the Buffer is mainly configured for temporary storage of data. Exemplarily, referring to FIG. 1, the Buffer may temporarily store the data sent from the main control chip 10 or temporarily store the data sent from the semiconductor memory 40 to the main control chip 10, and can coordinate and buffer the high-speed main control chip 10 and the low-speed semiconductor memory 40, so as to realize the synchronization of data transmission.

The embodiment provides a timing sequence control circuit 200. The timing sequence compensation module is arranged, and compensation delay adjustment is performed on the initial sampling signal by using the supply voltage and the compensation capacitor, so that the influence of the change of a parameter such as the internal working voltage or working temperature on the delay time may be reduced, and accordingly the accuracy of the delay time can be improved and timing sequence synchronization between the initial sampling signal and the DQ signal can be improved.

In another embodiment of the disclosure, taking the LPDDR4 chip as an example, the delay time tDQS2DQ of the DQS signal is relatively large. In order to compensate for the delay time, all DQ signals have to delay the time of tDQS2DQ backward, resulting in a slow writing speed. In addition, the delay time is very sensitive to the internal working voltage and working temperature, so the control module has to check the changes of the internal working voltage and working temperature frequently. If the changes extend a certain range, it is necessary to reset the tDQS2DQ. The parameter that changes relative to the internal working voltage is called tDQS2DQ_volt, and the parameter that changes relative to the working temperature is called tDQS2DQ_temp. These three parameters, tDQS2DQ, tDQS2DQ_volt and tDQS2DQ_temp, shall be as small as possible when meeting the technical standards. Based thereon, the embodiment of the disclosure provides a timing sequence control circuit, which can obtain a fast and stable DQS signal so as to reduce the three parameters of tDQS2DQ, tDQS2DQ_volt and tDQS2DQ_temp.

Figure 6:
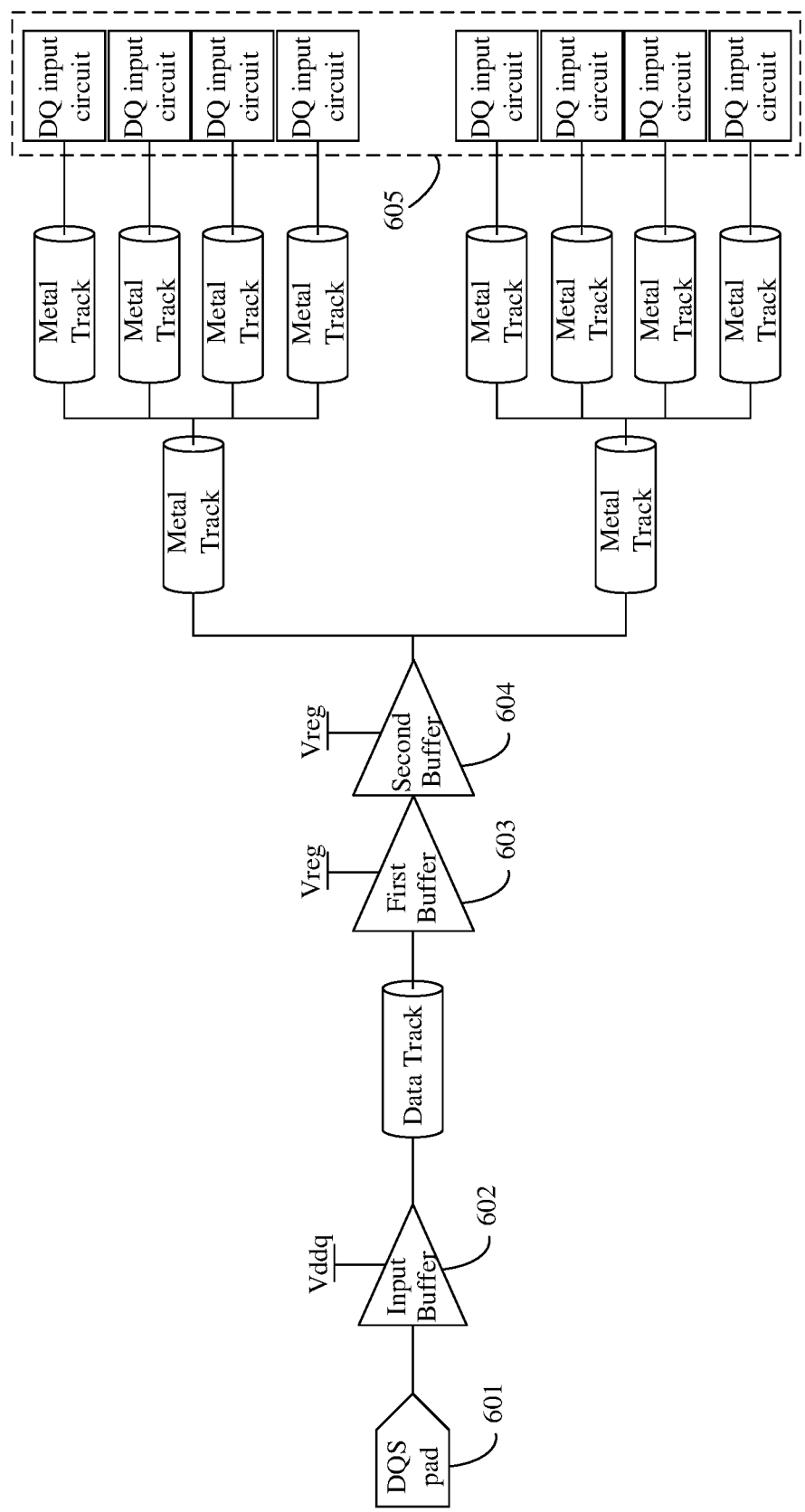
FIG. 6 is a frame diagram of DQS signal transmission according to an embodiment of the disclosure.

Referring to FIG. 6, FIG. 6 illustrates a frame diagram of DQS signal transmission according to an embodiment of the disclosure. As illustrated in FIG. 6, a DQS pad 601, an Input Buffer 602, a first Buffer 603, a second Buffer 604, and eight DQ input circuits 605 may be included. Herein, a Metal Track is arranged between the Input Buffer 602 and the first Buffer 603, and a Metal Track is arranged between the second Buffer 604 and the eight DQ input circuits 605. Here, the working voltage of the Input Buffer 602 is a Vddq voltage, and the working voltages of the first Buffer 603 and the second Buffer 604 are Vreg voltages.

Specifically, starting with entering the Input Buffer 602 from the DQS pad 601, the subsequent transmission line of the DQS signal may partially or completely work under an internal stabilized voltage supply according to requirements, and the stabilized voltage supply may provide a stable Vreg voltage. In addition, the voltage of the stabilized voltage supply may be generated from an internal charge pump or Vdd1 voltage, so as to obtain a voltage higher than Vdd2 or Vddq. Since higher voltage may provide higher speed, a higher-speed internal DQS signal can be obtained. That is, smaller tDQS2DQ is obtained. If all the transmission lines of the DQS signal work at Vreg voltage, tDQS2DQ may be smaller than tDQS2DQ brought by Vdd2/Vddq voltage.

Meanwhile, there exist the following two reasons: the working voltage of the DQS signal is generated by the internal stabilized voltage supply, and the DQS signal is little affected relative to the external Vdd2 voltage change; in the case where the delay time is smaller, the absolute value of delay time change may also be smaller even if changes happen by the same percentage. Therefore, the embodiment of the disclosure provides a timing sequence control circuit, which can simultaneously obtain smaller tDQS2DQ_volt and tDQS2DQ_temp.

Furthermore, in the embodiment of the disclosure, in order to obtain a faster tDQS2DQ, the Vreg voltage shall be higher than the voltage of Vdd2 or Vddq. As illustrated in FIG. 6, the Vreg voltage may be used as the working voltage of the Input Buffer 602 of the DQS signal in the figure, may also be used as the working voltage of the first Buffer 603 and the second Buffer 604 in the subsequent transmission line, or may be used as the working voltage of the two at the same time, which may be set according to a specific case, but is not specifically limited here. In addition, it is also to be noted that the Vreg voltage here may be a stable working voltage provided by the stabilized voltage supply, while Vdd1 voltage, Vdd2 voltage and Vddq voltage are the working voltages of the semiconductor memory defined in technical standards (such as JEDEC standard JESD209-4 or JESD209-4B).

Thus, in the embodiment of the disclosure, different delay times tDQS2DQ may be obtained by adjusting the value of the Vreg voltage. Some test modes may also be added to the adjustment, so that better adjustment and testing may be performed after the LPDDR4 chip is produced.

Figure 7:
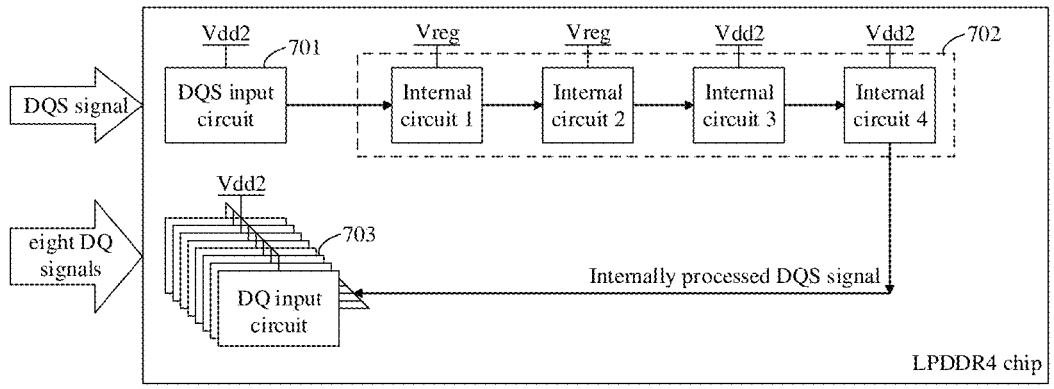
FIG. 7 is a detailed structure diagram of a timing sequence control circuit of a Low Power Double Data Rate SDRAM 4 (LPDDR4) chip.

In a specific implementation mode, still taking the semiconductor memory as an LPDDR4 chip as an example, referring to FIG. 7, FIG. 7 illustrates a detailed structural diagram of a timing sequence control circuit of the LPDDR4 chip. As illustrated in FIG. 7, the timing sequence control circuit may include a DQS input circuit 701, a signal transmission module 702 and a DQ input circuit 703. Herein, the signal transmission module 702 may include an internal circuit 1, an internal circuit 2, an internal circuit 3 and an internal circuit 4, and the DQ input circuit 703 may include eight DQ signal input circuits.

It is to be noted that, in FIG. 7, the working voltages of the DQS input circuit 701 and the DQ input circuit 703 are Vdd2 voltage, the working voltages of internal circuits 1 and 2 are Vreg voltage, and the working voltages of internal circuits 3 and 4 are Vdd2 voltage. Here, the DQS input circuit 701 is configured to receive the DQS signal, and the DQ input circuit 703 is configured to receive the DQ signal. Furthermore, the DQS signal is transmitted to the DQ input circuit 703 after passing through the internal circuit 1, the internal circuit 2, the internal circuit 3 and the internal circuit 4, so as to realize data sampling on the DQ signal by the DQS signal.

Figure 8:
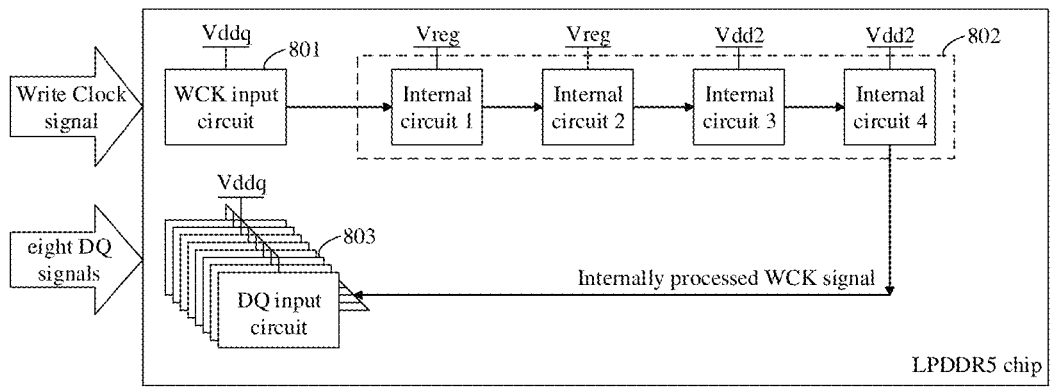
FIG. 8 is a detailed structural diagram of a timing sequence control circuit of an LPDDR4 chip.

In another specific implementation mode, taking the semiconductor memory as an LPDDR5 chip as an example, referring to FIG. 8, FIG. 8 illustrates a detailed structural diagram of a timing sequence control circuit of the LPDDR5 chip. As illustrated in FIG. 8, the timing sequence control circuit may include a WCK input circuit 801, a signal transmission module 802 and a DQ input circuit 803. Herein, the signal transmission module 802 may include an internal circuit 1, an internal circuit 2, an internal circuit 3 and an internal circuit 4, and the DQ input circuit 803 may include eight DQ signal input circuits.

It is to be noted that, in FIG. 8, the working voltages of the WCK input circuit 801 and the DQ input circuit 803 are Vddq voltage, the working voltages of internal circuits 1 and 2 are Vreg voltage, and the working voltages of internal circuits 3 and 4 are Vdd2 voltage. Here, the WCK input circuit 801 is configured to receive the WCK signal, and the DQ input circuit 803 is configured to receive the DQ signal. Furthermore, the WCK signal is transmitted to the DQ input circuit 803 after passing through the internal circuit 1, the internal circuit 2, the internal circuit 3 and the internal circuit 4, so as to realize data sampling on the DQ signal by the WCK signal.

Specifically, whether it is the LPDDR4 chip illustrated in FIG. 7 or the LPDDR5 chip illustrated in FIG. 8, for the initial sampling signal (DQS signal or WCK signal), since the delay time of the initial sampling signal on the transmission line is affected by the internal working voltage Vdd2, the unstable change of Vdd2 leads to the instability of the delay time on the transmission line. Of course, the delay time of the DQS signal on the transmission line is also affected by other factors such as temperature change. The unstable temperature change leads to instability of the delay time on the transmission line. Therefore, some internal circuits in the embodiment of the disclosure, such as internal circuit 1 and internal circuit 2, may be powered by a stable Vreg voltage. However, it is to be pointed out that the number of internal circuits connected with the stable Vreg voltage is not specifically limited, and same may be any one or more internal circuits, as long as at least one internal circuit connected with the Vreg voltage is satisfied, all of which are within the scope of protection of the disclosure. Exemplarily, in addition to the internal circuit 1 and the internal circuit 2 illustrated in FIG. 7 or FIG. 8 being connected with the Vreg voltage, the internal circuit 1, the internal circuit 2, the internal circuit 3 and the internal circuit 4 may all be connected with the Vreg voltage, which is not limited here.

It is to be seen that in the above two implementation modes, a modulated Vreg voltage is used as the working voltage of some internal circuits, so as to realize timing sequence compensation of the initial sampling signal on the transmission line. However, in these two implementation modes, a pull-up switching transistor in the internal circuit is not directly connected with the Vreg voltage, but is connected with the Vreg voltage through an additional MOS transistor (not illustrated in FIGS. 7 and 8) controlled by an adjustable power supply. Thus, the overall pull-up ability is weak, and the load on the front stage is also large. In order to make the high-speed signal work normally, it is necessary to increase the number of stages, thus affecting the improvement of the overall speed.

Based thereon, in the embodiment of the disclosure, the compensation capacitor introduced into the circuit node is adjusted by the adjustable supply voltage, so that timing sequence compensation is realized. Specifically, in some embodiments, on the basis of the timing sequence control circuit 200 illustrated in FIG. 3, referring to FIG. 9, the timing sequence control circuit 200 also includes a stabilized voltage supply 206 and a control module 207. The control module 207 is connected with the stabilized voltage supply 206.

Herein, the control module 207 is configured to detect a parameter change in the timing sequence control circuit 200, and control the stabilized voltage supply 206 to generate the supply voltage corresponding to the parameter change according to the parameter change and a preset supply voltage generation strategy.

Here, the stabilized voltage supply 206 is mainly configured to provide a stable supply voltage for the timing sequence compensation module 202, that is, the aforementioned Vreg voltage. In addition, the control module 207 may detect the parameter change in the timing sequence control circuit 200. The parameter change here may include a temperature change generated by the timing sequence control circuit 200 in the working process, and a voltage change that follows the changing working environment, such as the voltage change provided to the clock input circuit 203 and the data input circuit 204, and the voltage change provided to the internal circuit not connected with the timing sequence compensation module 202.

In a specific implementation mode, the parameter change in the timing sequence control circuit 200 is a temperature change in the timing sequence control circuit, and the preset supply voltage generation strategy is that the temperature is negatively correlated with the supply voltage within a preset temperature range.

In another specific implementation mode, the parameter change in the timing sequence control circuit 200 is a voltage change of an internal circuit, not connected with the timing sequence compensation module, in the timing sequence control circuit, and the preset supply voltage generation strategy is that the voltage of the internal circuit not connected with the timing sequence compensation module is positively correlated with the supply voltage.

It is to be noted that, in the embodiment of the disclosure, a stable supply voltage output corresponding to the parameter change is generated according to the parameter change and the preset supply voltage generation strategy, and the stable supply voltage is output to the internal circuit. Herein, the preset supply voltage generation strategy is preset according to the above-described parameter change. For example, in general, the higher the temperature is, the slower the transmission speed of the DQS/WCK signal in the transmission line is and the larger the delay is. Therefore, in a certain temperature range, as the temperature rises, the supply voltage output by the stabilized voltage supply 206 is adjusted to decrease at this time, so as to reduce the discharge speed of the compensation capacitor, thereby reducing the delay brought by the timing sequence compensation module 202, and obtaining the delay time which tends to be stable with the temperature change. Or, for the voltage of some internal circuits not connected with the timing sequence compensation module, when the voltage Vdd2 or Vddq supplied to these internal circuits increases, the supply voltage output by the stabilized voltage supply 206 is adjusted to increase at this time, so as to improve the discharge speed of the compensation capacitor, and further increase the delay brought by the timing sequence compensation module 202, so as to obtain the delay time that tends to be stable with the voltage change.

Thus, the supply voltage of the timing sequence compensation module may be a stable supply voltage provided by the stabilized voltage supply 206, and the generation of the stable supply voltage is based on detecting the parameter change in the timing sequence control circuit, and according to the parameter change and the preset supply voltage generation strategy, the control module 207 generates the stable supply voltage corresponding to the parameter change for output. That is, the stable supply voltage is generated according to the constantly changing parameter such as voltage and temperature, which may effectively reduce the influence of the parameter such as the internal working voltage or working temperature on the delay time, thereby improving the accuracy of the delay time and improving the timing sequence synchronization between the initial sampling signal and the DQ.

In some embodiments, the supply voltage may be provided by an internal working power supply or a charge pump. Herein, the charge pump is configured to generate the internal working power supply based on an external power supply.

It is to be noted that, in the embodiment of the disclosure, the working voltage of the internal working power supply may be Vdd1. In addition, the supply voltage here may be larger than the voltage Vdd2 or Vddq provided by the internal working power supply. Herein, Vdd1 voltage, Vdd2 voltage and Vddq voltage are the working voltages of the semiconductor memory defined in technical standards (such as JEDEC standard JESD209-4 or JESD209-4B).

It is also to be noted that, in the embodiment of the disclosure, when the supply voltage is provided by the internal working power supply or charge pump that provides the working voltage Vdd1, and/or when the supply voltage is greater than the voltage Vdd2 or Vddq output to other internal circuits, a higher working voltage is provided to the internal circuits through the timing sequence compensation module, so that the total voltage on the whole transmission line is increased, thus accelerating the transmission speed of the DSQ signal in the transmission line. Therefore, the influence of the change of Vdd2 or Vddq on the total voltage of the whole transmission line is effectively reduced, and the influence of the change of Vdd2 or Vddq on the delay time is further effectively reduced.

Figure 9:
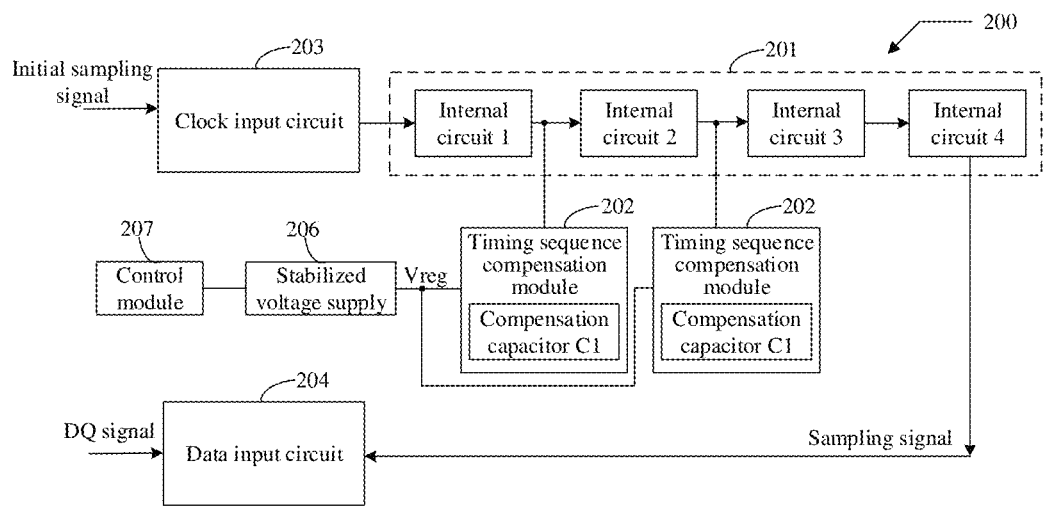
FIG. 9 is a composition structure diagram V of a timing sequence control circuit according to an embodiment of the disclosure.
Figure 10:
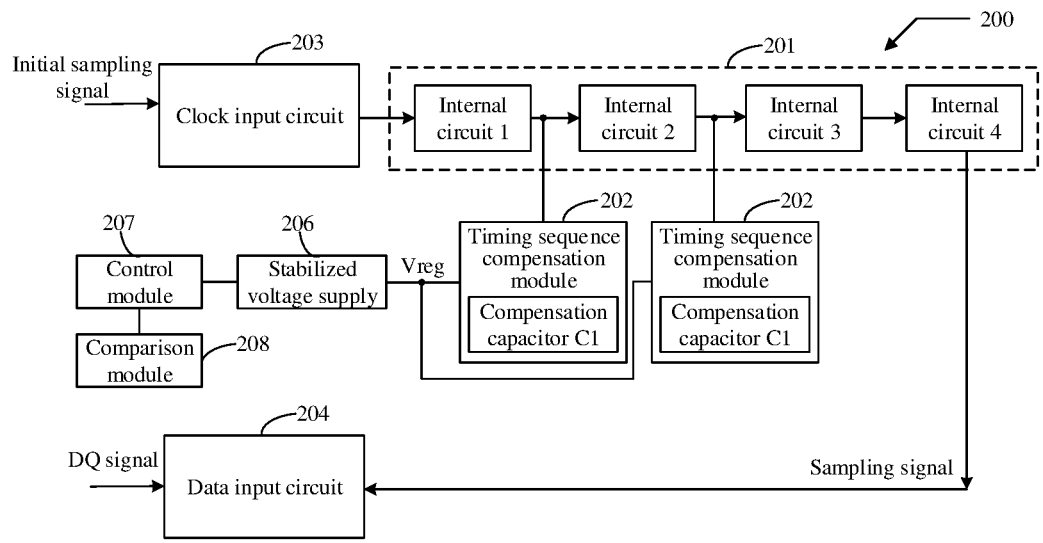
FIG. 10 is a composition structure diagram VI of a timing sequence control circuit according to an embodiment of the disclosure.

In some embodiments, on the basis of the timing sequence control circuit 200 illustrated in FIG. 9, referring to FIG. 10, the timing sequence control circuit 200 may also include a comparison module 208, and the comparison module 208 is connected with the control module 207.

Herein, the comparison module 208 is configured to perform rising edge comparison between the sampling signal and the to-be-sampled DQ signal, and determine a rising edge time difference value of the sampling signal and the to-be-sampled DQ signal within the same clock cycle.

The control module 207 is further configured to acquire the rising edge time difference value output by the comparison module 208, and generate the supply voltage corresponding to the rising edge time difference value according to the rising edge time difference value and the preset supply voltage generation strategy.

It is to be noted that, in the embodiment of the disclosure, the rising edge time difference value of the sampling signal and the to-be-sampled DQ in the same clock cycle may also be determined through the comparison module 208, and then the supply voltage corresponding to the rising edge time difference value is generated through the control module 207 for output. Thus, the discharge speed of the compensation capacitor is adjusted according to the supply voltage corresponding to the rising edge time difference value, so that the overall delay time tDQS2DQ can be adjusted, and the time difference between the sampling signal and the to-be-sampled DQ signal can meet the preset requirement, thus improving the timing sequence synchronization between the DQS/WCK signal and the DQ signal.

Figure 11:
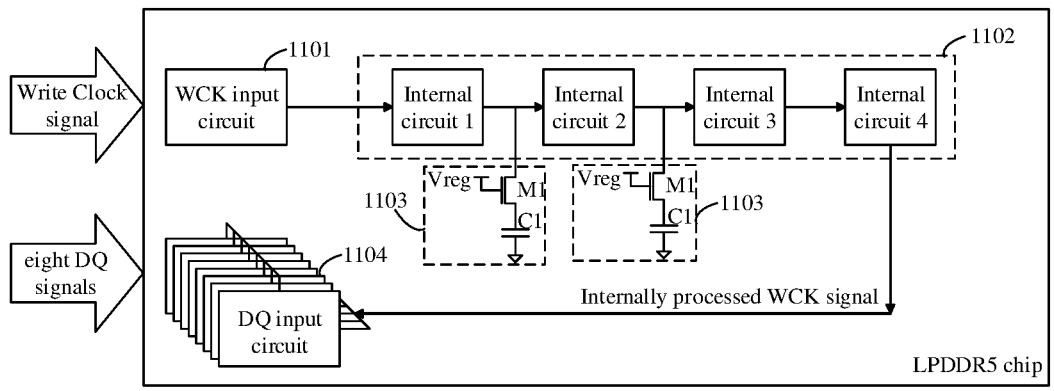
FIG. 11 is a detailed structure diagram I of a timing sequence control circuit of an LPDDR5 chip according to an embodiment of the disclosure.

Exemplarily, taking the semiconductor memory as an LPDDR5 chip as an example, referring to FIG. 11, FIG. 11 illustrates a detailed structural diagram of a timing sequence control circuit of the LPDDR5 chip according to an embodiment of the disclosure. As illustrated in FIG. 11, the timing sequence control circuit may include a WCK input circuit 1101, a signal transmission module 1102, a timing sequence compensation module 1103 and a DQ input circuit 1104.

Herein, in FIG. 11, the signal transmission module 1102 may include an internal circuit 1, an internal circuit 2, an internal circuit 3 and an internal circuit 4, the timing sequence compensation module 1103 may include a first switching transistor M1 and a compensation capacitor C1, and the DQ input circuit 1104 may include eight DQ signal input circuits. In addition, the output end of the internal circuit 1 and the output end of the internal circuit 2 are respectively connected with a timing sequence compensation module 1103. For the timing sequence compensation module 1103, the gate electrode of the first switching transistor M1 is connected with the Vreg voltage, the source electrode of the first switching transistor M1 is connected with one end of the compensation capacitor C1, the other end of the compensation capacitor C1 is connected with a low level, and the drain electrode of the first switching transistor M1 is connected with the output end of the corresponding internal circuit.

Figure 12:
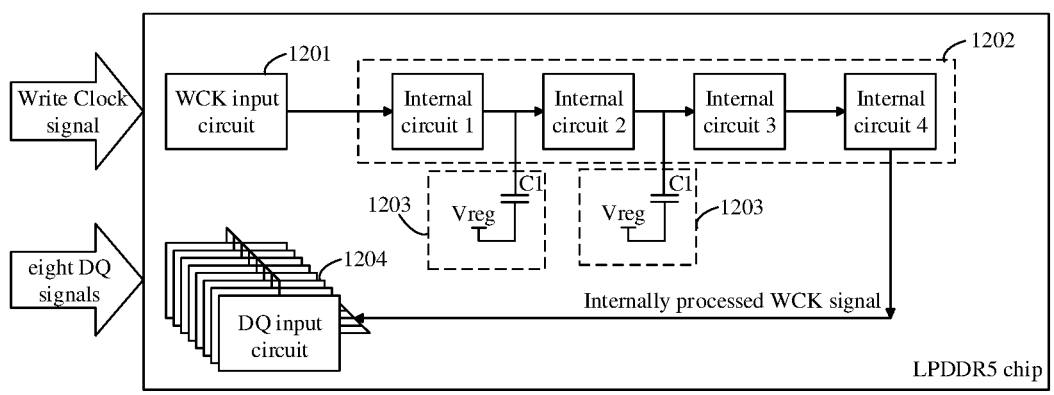
FIG. 12 is a detailed structure diagram II of a timing sequence control circuit of an LPDDR5 chip according to an embodiment of the disclosure.

Exemplarily, still taking the semiconductor memory as an LPDDR5 chip as an example, referring to FIG. 12, FIG. 12 illustrates a detailed structural diagram of a timing sequence control circuit of another LPDDR5 chip according to an embodiment of the disclosure. As illustrated in FIG. 12, the timing sequence control circuit may include a WCK input circuit 1201, a signal transmission module 1202, a timing sequence compensation module 1203 and a DQ input circuit 1204.

Herein, in FIG. 12, the signal transmission module 1202 may include an internal circuit 1, an internal circuit 2, an internal circuit 3 and an internal circuit 4, the timing sequence compensation module 1203 may only include a compensation capacitor C1, and the DQ input circuit 1204 may include eight DQ signal input circuits. In addition, the output end of the internal circuit 1 and the output end of the internal circuit 2 are respectively connected with a timing sequence compensation module 1203. For the timing sequence compensation module 1203, one end of the compensation capacitor C1 is connected with the Vreg voltage, and the other end of the compensation capacitor C1 is connected with the output end of the corresponding internal circuit.

In brief, in the embodiment of the disclosure, the compensation capacitance introduced into the circuit can be adjusted by adjusting the supply voltage, so that compensation is performed on the timing sequence. Herein, the Vreg voltage may be provided by an internally generated stabilized voltage supply. Here, the internal power supply of the Vreg voltage generating circuit may be a charge pump powered by other voltages, or Vdd1 may be directly used as the internal power supply.

Thus, when the temperature rises or the working voltage decreases, the output Vreg voltage may be automatically adjusted, so as to adjust the amount of dischargeable charge of the compensation capacitor introduced into the tDQS2DQ path, and further adjust the delay time of the whole tDQS2DQ. That is, different tDQS2DQ may be obtained by adjusting the value of the Vreg voltage. Some test modes may also be added to the adjustment, so that better adjustment and testing may be performed after the LPDDR5 chip is produced. Through the above-mentioned embodiment, the specific implementation of the aforementioned embodiments is described in detail. It is to be seen that, according to the technical solution of the aforementioned embodiments, the timing sequence compensation module is arranged, and compensation delay adjustment is performed on the initial sampling signal using the supply voltage and the compensation capacitor, so that the influence of the change of a parameter such as the internal working voltage or working temperature on the delay time may be reduced, and accordingly the accuracy of the delay time can be improved and timing sequence synchronization between the initial sampling signal and the DQ can be improved.

Figure 13:
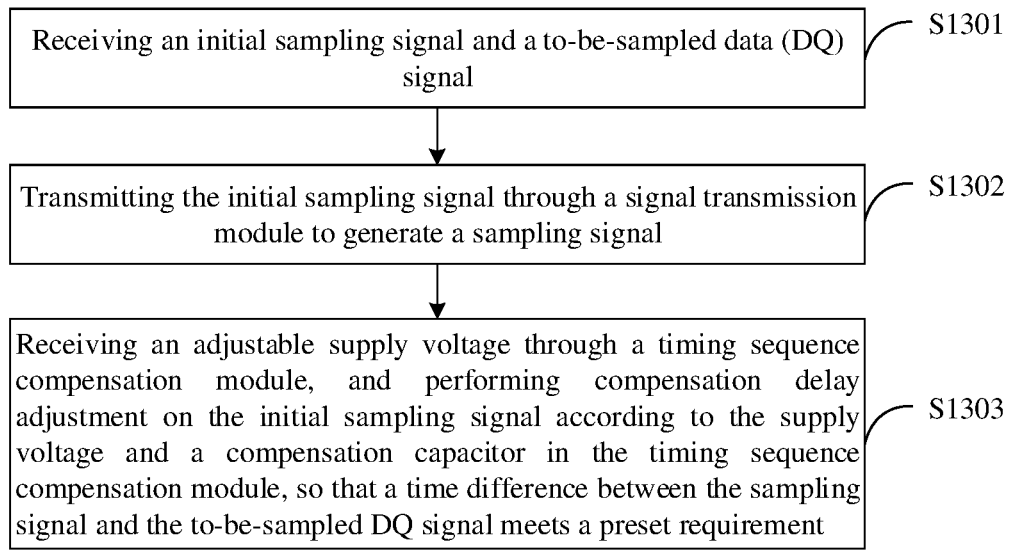
FIG. 13 is a flowchart of a method for timing sequence control according to an embodiment of the disclosure.

In yet another embodiment of the disclosure, referring to FIG. 13, FIG. 13 illustrates a flowchart of a method for timing sequence control according to an embodiment of the application. As illustrated in FIG. 13, the method may include the following operations.

At S1301, an initial sampling signal and a to-be-sampled DQ signal are received.

At S1302, the initial sampling signal is transmitted through a signal transmission module to generate a sampling signal.

At S1303, an adjustable supply voltage is received through a timing sequence compensation module, and compensation delay adjustment is performed on the initial sampling signal according to the supply voltage and a compensation capacitor in the timing sequence compensation module, so that a time difference between the sampling signal and the to-be-sampled DQ signal meets a preset requirement.

It is to be noted that, in the embodiment of the disclosure, the method for timing sequence control is applied to the timing sequence control circuit described in the aforementioned embodiments. Herein, the timing sequence control circuit may include a signal transmission module and a timing sequence compensation module so as to improve the timing sequence synchronization between the initial sampling signal and the DQ.

In some embodiments, the timing sequence compensation module may include a compensation capacitor. For S1303, the operation may include that: a supply voltage is provided and adjusted by a power supply module so as to adjust the discharge speed of the compensation capacitor through coupling effect.

In some embodiments, the timing sequence compensation module may include a compensation capacitor and a first switching transistor. For S1303, the operation may include that: a supply voltage is provided and adjusted by the power supply module so as to control the conduction degree of the first switching transistor, and adjust the discharge speed of the compensation capacitor according to the conduction degree of the first switching transistor.

In some embodiments, the timing sequence control circuit may also include a stabilized voltage supply and a control module, and the control module is connected with the stabilized voltage supply. Correspondingly, for S1301, the operation may include that: a parameter change in the timing sequence control circuit is detected through the control module; and the stabilized voltage supply is controlled to generate the supply voltage corresponding to the parameter change according to the parameter change and a preset supply voltage generation strategy.

Furthermore, in some embodiments, the parameter change in the timing sequence control circuit is a temperature change in the timing sequence control circuit. For S1301, the operation may also include the following operations.

When the temperature change in the timing sequence control circuit is detected, the preset supply voltage generation strategy is determined to be that the temperature is negatively correlated with the supply voltage within a preset temperature range.

The corresponding supply voltage output is generated according to the temperature change and the preset supply voltage generation strategy.

Further, in some embodiments, the parameter change in the timing sequence control circuit is a voltage change of an internal circuit, not connected with the timing sequence compensation module, in the timing sequence control circuit. For S1301, the operation may also include the following operations.

When the voltage change of an internal circuit, not connected with the timing sequence compensation module, in the timing sequence control circuit is detected, the preset supply voltage generation strategy is determined to be that the voltage of the internal circuit not connected with the timing sequence compensation module is positively correlated with the supply voltage.

A corresponding supply voltage output is generated according to the voltage change of an internal circuit, not connected with the timing sequence compensation module, in the timing sequence control circuit and the preset supply voltage generation strategy.

The embodiment provides a method for timing sequence control. An initial sampling signal and a to-be-sampled DQ signal are received. The initial sampling signal is transmitted through a signal transmission module to generate a sampling signal. An adjustable supply voltage is received through a timing sequence compensation module, and compensation delay adjustment is performed on the initial sampling signal according to the supply voltage and a compensation capacitor in the timing sequence compensation module, so that the time difference between the sampling signal and the to-be-sampled DQ signal meets a preset requirement. Thus, the timing sequence compensation module is arranged, and compensation delay adjustment is performed on the initial sampling signal using the supply voltage and the compensation capacitor, so that the influence of the change of a parameter such as the internal working voltage or working temperature on the delay time may be reduced, and accordingly the accuracy of the delay time can be improved and timing sequence synchronization between the initial sampling signal and the DQ signal can be improved.

Figure 14:
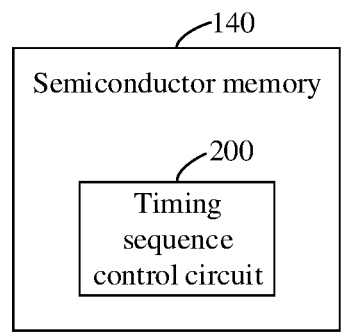
FIG. 14 is a composition structure diagram of a semiconductor memory according to an embodiment of the present disclosure.

In still another embodiment of the disclosure, referring to FIG. 14, FIG. 14 illustrates a composition structure diagram of a semiconductor memory 140 according to an embodiment of the disclosure. As illustrated in FIG. 14, the semiconductor memory 140 may include the timing sequence control circuit 200 of any one of the previous embodiments.

In some embodiments of the disclosure, the semiconductor memory 140 is a DRAM chip.

Further, in some embodiments, the DRAM chip meets the DDR5 memory specification.

It is to be noted that, in the embodiment of the disclosure, the embodiment of the disclosure relates to semiconductor integrated circuit design, an adjustable supply voltage being used as the power supply, and applied to the high-speed DQS circuit.

It is also to be noted that, in the embodiment of the disclosure, for the semiconductor memory 140, the timing sequence compensation module is arranged in the semiconductor memory 140, and compensation delay adjustment is performed on the initial sampling signal using the supply voltage and the compensation capacitor, so that the influence of the change of a parameter such as the internal working voltage or working temperature on the delay time may be reduced, and accordingly the accuracy of the delay time can be improved and timing sequence synchronization between the initial sampling signal and the DQ signal can be improved.

The foregoing descriptions are only preferred embodiments of the disclosure and are not intended to limit the scope of protection of the disclosure.

It is to be noted that terms "include" and "contain" or any other variant thereof is intended to cover nonexclusive inclusions herein, so that a process, method, object or device including a series of elements not only includes those elements but also includes other elements which are not clearly listed or further includes elements intrinsic to the process, the method, the object or the device. Without further restrictions, the element defined by the statement "including a . . . " does not exclude the existence of another same element in the process, method, article or device including the element.

The sequence numbers of the embodiments of the disclosure are adopted not to represent superiority-inferiority of the embodiments but only for description.

The methods disclosed in several method embodiments provided in the present disclosure may be arbitrarily combined without conflict to obtain a new method embodiment.

The features disclosed in a plurality of product embodiments provided in the present disclosure may be arbitrarily combined without conflict to obtain a new product embodiment.

The features disclosed in the several method or device embodiments provided in the present disclosure may be arbitrarily combined without conflict to obtain a new method embodiment or device embodiment.

The above is only the specific implementation mode of the present disclosure and not intended to limit the scope of protection of the present disclosure. Any variations or replacements apparent to those skilled in the art within the technical scope disclosed by the present disclosure shall fall within the scope of protection of the present disclosure. Therefore, the scope of protection of the present disclosure shall be subject to the scope of protection of the claims.

What is claimed is:

1. A circuit for controlling a timing sequence, comprising a signal transmission module and a timing sequence compensation module, wherein the timing sequence compensation module is connected with the signal transmission module,
   wherein the signal transmission module is configured to receive an initial sampling signal and transmit the initial sampling signal to generate a sampling signal,
   wherein the timing sequence compensation module at least comprises a compensation capacitor, the timing sequence compensation module is configured to receive an adjustable supply voltage, and perform compensation delay adjustment on the initial sampling signal according to the supply voltage and the compensation capacitor, so that a time difference between the sampling signal and a to-be-sampled data (DQ) signal meets a preset requirement;
   wherein the timing sequence control circuit further comprises a stabilized voltage supply and a control module, the control module is connected with the stabilized voltage supply,
   wherein the control module is configured to detect a parameter change in the timing sequence control circuit, and control the stabilized voltage supply to generate the supply voltage corresponding to the parameter change according to the parameter change and a preset supply voltage generation strategy;
   wherein the timing sequence control circuit further comprises a comparison module, the comparison module is connected with the control module, wherein the comparison module is configured to perform a rising edge comparison between the sampling signal and the to-be-sampled DQ signal, and determine a rising edge time difference value of the sampling signal and the to-be-sampled DQ signal within a same clock cycle, wherein the control module is further configured to acquire the rising edge time difference value output by the comparison module, and generate the supply voltage corresponding to the rising edge time difference value according to the rising edge time difference value and the preset supply voltage generation strategy.

2. The circuit of claim 1, wherein the timing sequence control circuit further comprises a clock input circuit and a data input circuit, an input end of the signal transmission module is connected with the clock input circuit, and an output end of the signal transmission module is connected with the data input circuit, wherein the signal transmission module comprises at least one internal circuit, when there are a plurality of internal circuits, the plurality of internal circuits are connected in sequence in a transmission direction from the clock input circuit to the data input circuit.

3. The circuit of claim 2, wherein there is at least one timing sequence compensation module, different timing sequence compensation modules correspond to different internal circuits, and each timing sequence compensation module is connected with an output end of a corresponding internal circuit to perform timing sequence compensation on an output signal of the internal circuit.

4. The circuit of claim 2, wherein the timing sequence control circuit further comprises a power supply module, one end of the compensation capacitor is connected with the power supply module, and another end of the compensation capacitor is connected with an output end of a corresponding internal circuit, wherein the power supply module is configured to provide and adjust the supply voltage, so as to adjust a discharge speed of the compensation capacitor through coupling effect.

5. The circuit of claim 4, wherein the timing sequence compensation module further comprises a first switching transistor, a gate electrode of the first switching transistor is connected with the power supply module, a source electrode of the first switching transistor is connected with one end of the compensation capacitor, another end of the compensation capacitor is connected with a low level, and a drain electrode of the first switching transistor being connected with the output end of the corresponding internal circuit, wherein the power supply module is configured to provide and adjust the supply voltage so as to control the conduction degree of the first switching transistor, and adjust the discharge speed of the compensation capacitor according to the conduction degree of the first switching transistor.

6. The circuit of claim 4, wherein the compensation capacitor is configured to adjust a delay time of the initial sampling signal, wherein when an initial delay time of the initial sampling signal by the timing sequence control circuit is increased, a discharge speed of the compensation capacitor is reduced so as to reduce a delay time of the initial sampling signal by the compensation capacitor, wherein when the initial delay time of the initial sampling signal by the timing sequence control circuit is reduced, the discharge speed of the compensation capacitor is increased so as to increase the delay time of the initial sampling signal by the compensation capacitor.

7. The circuit of claim 2, wherein the internal circuit comprises a buffer.

8. The circuit of claim 1, wherein the parameter change in the timing sequence control circuit is a temperature change in the timing sequence control circuit, and the preset supply voltage generation strategy is that a temperature is negatively correlated with the supply voltage within a preset temperature range.

9. The circuit of claim 1, wherein the parameter change in the timing sequence control circuit is a voltage change of an internal circuit, which is not connected with the timing sequence compensation module, in the timing sequence control circuit, and the preset supply voltage generation strategy is that a voltage of the internal circuit not connected with the timing sequence compensation module is positively correlated with the supply voltage.

10. The circuit of claim 1, wherein the supply voltage is provided by an internal working power supply or a charge pump, and the charge pump is configured to generate an internal working power supply based on an external power supply.

11. The circuit of claim 1, wherein the timing sequence control circuit is configured to adjust a timing sequence relationship between the initial sampling signal and the DQ signal, wherein the initial sampling signal input by the signal transmission module is one of the following: a data strobe (DQS) signal and a write clock (WCK) signal.

12. A semiconductor memory, comprising a circuit for controlling a timing sequence, wherein the circuit for controlling the timing sequence comprises a signal transmission module and a timing sequence compensation module, wherein the timing sequence compensation module is connected with the signal transmission module, wherein the signal transmission module is configured to receive an initial sampling signal and transmit the initial sampling signal to generate a sampling signal, wherein the timing sequence compensation module at least comprises a compensation capacitor, the timing sequence compensation module is configured to receive an adjustable supply voltage, and perform compensation delay adjustment on the initial sampling signal according to the supply voltage and the compensation capacitor, so that a time difference between the sampling signal and a to-be-sampled data (DQ) signal meets a preset requirement;

wherein the timing sequence control circuit further comprises a stabilized voltage supply and a control module, the control module is connected with the stabilized voltage supply, wherein the control module is configured to detect a parameter change in the timing sequence control circuit, and control the stabilized voltage supply to generate the supply voltage corresponding to the parameter change according to the parameter change and a preset supply voltage generation strategy;

wherein the timing sequence control circuit further comprises a comparison module, the comparison module is connected with the control module, wherein the comparison module is configured to perform a rising edge comparison between the sampling signal and the to-be-sampled DQ signal, and determine a rising edge time difference value of the sampling signal and the to-be-sampled DQ signal within a same clock cycle, wherein the control module is further configured to acquire the rising edge time difference value output by the comparison module, and generate the supply voltage corresponding to the rising edge time difference value according to the rising edge time difference value and the preset supply voltage generation strategy.

13. The semiconductor memory of claim 12, wherein the timing sequence control circuit further comprises a clock input circuit and a data input circuit, an input end of the signal transmission module is connected with the clock input circuit, and an output end of the signal transmission module is connected with the data input circuit, wherein the signal transmission module comprises at least one internal circuit, when there are a plurality of internal circuits, the plurality of internal circuits are connected in sequence in a transmission direction from the clock input circuit to the data input circuit.

14. The semiconductor memory of claim 13, wherein there is at least one timing sequence compensation module, different timing sequence compensation modules correspond to different internal circuits, and each timing sequence compensation module is connected with an output end of a corresponding internal circuit to perform timing sequence compensation on an output signal of the internal circuit.

15. The semiconductor memory of claim 13, wherein the timing sequence control circuit further comprises a power supply module, one end of the compensation capacitor is connected with the power supply module, and another end of the compensation capacitor is connected with an output end of a corresponding internal circuit, wherein the power supply module is configured to provide and adjust the supply voltage, so as to adjust a discharge speed of the compensation capacitor through coupling effect.

16. The semiconductor memory of claim 15, wherein the timing sequence compensation module further comprises a first switching transistor, a gate electrode of the first switching transistor is connected with the power supply module, a source electrode of the first switching transistor is connected with one end of the compensation capacitor, another end of the compensation capacitor is connected with a low level, and a drain electrode of the first switching transistor being connected with the output end of the corresponding internal circuit, wherein the power supply module is configured to provide and adjust the supply voltage so as to control the conduction degree of the first switching transistor, and adjust the discharge speed of the compensation capacitor according to the conduction degree of the first switching transistor.

17. The semiconductor memory of claim 15, wherein the compensation capacitor is configured to adjust a delay time of the initial sampling signal, wherein when an initial delay time of the initial sampling signal by the timing sequence control circuit is increased, a discharge speed of the compensation capacitor is reduced so as to reduce a delay time of the initial sampling signal by the compensation capacitor, wherein when the initial delay time of the initial sampling signal by the timing sequence control circuit is reduced, the discharge speed of the compensation capacitor is increased so as to increase the delay time of the initial sampling signal by the compensation capacitor.

* * * * *